(12) United States Patent
Nishimura et al.

(10) Patent No.: US 10,715,031 B2
(45) Date of Patent: Jul. 14, 2020

(54) POWER CONVERTER

(71) Applicant: Mitsubishi Electric Corporation, Tokyo (JP)

(72) Inventors: Kengo Nishimura, Tokyo (JP); Satoshi Ishibashi, Tokyo (JP); Masahiro Noguchi, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 14 days.

(21) Appl. No.: 15/992,296

(22) Filed: May 30, 2018

(65) Prior Publication Data
US 2019/0157967 A1 May 23, 2019

(30) Foreign Application Priority Data

Nov. 20, 2017 (JP) ................................ 2017-222639

(51) Int. Cl.
*H02M 1/14* (2006.01)
*H05K 7/14* (2006.01)
(Continued)

(52) U.S. Cl.
CPC .......... *H02M 1/143* (2013.01); *H02M 3/158* (2013.01); *H05K 5/0217* (2013.01);
(Continued)

(58) Field of Classification Search
CPC ... H02M 1/143; H05K 5/0217; H05K 7/1401; H05K 7/2089; H01G 2/10; H01G 4/224;
(Continued)

(56) References Cited

U.S. PATENT DOCUMENTS

| | | | | | |
|---|---|---|---|---|---|
| 7,974,101 | B2* | 7/2011 | Azuma | ................... | B60K 6/48 361/760 |
| 8,369,100 | B2* | 2/2013 | Azuma | ................... | B60L 50/16 361/766 |

(Continued)

FOREIGN PATENT DOCUMENTS

| | | |
|---|---|---|
| JP | 2007-173321 A | 7/2007 |
| JP | 2009-26958 A | 2/2009 |

(Continued)

OTHER PUBLICATIONS

Preliminary Notice of Reasons for Rejection dated Nov. 27, 2018 in Japanese Application No. 2017-222639.

*Primary Examiner* — James Wu
*Assistant Examiner* — Hung Q Dang
(74) *Attorney, Agent, or Firm* — Sughrue Mion, PLLC; Richard C. Turner

(57) ABSTRACT

In order to achieve small noise and small vibration, as well as a small size and a low cost in a power converter including a capacitor module, there is provided a power converter including a power module and a capacitor module. The capacitor module includes: a plurality of capacitor elements each having a flat wound surface; an exterior case; a resin filler; and a restraint point. The exterior case has arranged therein an inclusion serving as a beam in a direction orthogonal to a flat wound surface of at least one capacitor element of the plurality of capacitor elements, and the at least one capacitor element, and the restraint point is arranged substantially in front of the flat wound surface via the inclusion.

9 Claims, 5 Drawing Sheets

(51) Int. Cl.
*H05K 5/02* (2006.01)
*H05K 7/20* (2006.01)
*H02M 3/158* (2006.01)

(52) U.S. Cl.
CPC ........... *H05K 7/1401* (2013.01); *H05K 7/209* (2013.01); *H05K 7/2089* (2013.01)

(58) Field of Classification Search
CPC .. H01G 4/32; H01G 4/38; H01G 9/08; H01G 9/14; H01G 9/26; H01G 9/28; H01G 11/08; H01G 11/10; H01G 11/78
See application file for complete search history.

(56) References Cited

U.S. PATENT DOCUMENTS

| | | | | |
|---|---|---|---|---|
| 8,422,244 B2 * | 4/2013 | Azuma | ................... | B60L 50/16 361/760 |
| 2011/0149625 A1 * | 6/2011 | Azuma | ................... | B60K 6/28 363/141 |

FOREIGN PATENT DOCUMENTS

| | | | | |
|---|---|---|---|---|
| JP | 2010-219259 A | 9/2010 | | |
| JP | 5189620 B | 2/2013 | | |
| JP | 2015-65759 A | 4/2015 | | |
| JP | 2015-84370 | * 4/2015 | ............... | H01G 4/18 |
| JP | 2015-084370 A | 4/2015 | | |
| JP | 2015-104146 A | 6/2015 | | |

* cited by examiner

POWER CONVERTER

BACKGROUND OF THE INVENTION

1. Field of the Invention

The present invention relates to an in-vehicle power converter to be mounted in a car and the like, and more particularly, to a power converter including a power module that forms a power conversion unit, for example, an inverter.

2. Description of the Related Art

A capacitor module is a main component of a power converter used for, for example, a hybrid car and an electric car. The capacitor module is formed of a plurality of capacitor elements each formed by winding a metalized film. The plurality of capacitor elements each formed by winding the metalized film are accommodated in a case and fixed thereto by filling the periphery of the capacitor elements with resin.

When a current is allowed to flow through the capacitor elements, an electric charge is stored in the capacitor module. Then, occurrence of Coulomb attraction due to the stored electric charge causes vibration of the capacitor elements. In particular, with an alternating current flowing through the capacitor elements, Coulomb force occurs between the wound metalized films to bring the films into contact with each other. Thus, vibration occurs due to a ripple current.

In a capacitor element formed by winding a metalized film in a flat shape, a flat wound surface vibrates easily as compared with both ends each formed in an arc shape (e.g., see Japanese Patent Application Laid-open No. 2015-084370).

Further, due to the occurrence of the vibration at the time when the current is allowed to flow through the capacitor elements, the vibration may be transmitted to a metal case via a capacitor case to generate vibration sound. In particular, with the current allowed to flow through the capacitor elements becoming large or with the current flowing intermittently, the vibration increases to generate large vibration sound, which has been problematic.

In order to deal with such a problem, there is a related-art technology in which a gap is provided between at least a pair of capacitor elements adjacent to each other and an inclusion is arranged in the gap to enhance the rigidity (e.g., see Japanese Patent Application Laid-open No. 2010-219259). In this related art, the inclusion is arranged so as to connect between a pair of opposed side walls of an exterior case, thereby suppressing vibration of the capacitor module.

However, the related-art technologies have problems as follows.

In the capacitor element formed by winding the metalized film in the flat shape, the flat wound surface vibrates easily as compared with both ends each formed in the arc shape. Therefore, in the related-art device described in Japanese Patent Application Laid-open No. 2015-084370, it is required to accommodate the capacitor elements in a resin case with the flat wound surfaces of the capacitor elements, each of which is formed by winding the metal film in the flat shape, facing the open surface of the case, and to mount the structure such that this open surface faces the outside of a vehicle. Therefore, Japanese Patent Application Laid-open No. 2015-084370 has the problem of having significant limitations on mounting layout.

In the related-art device described in Japanese Patent Application Laid-open No. 2010-219259, the inclusion is used to take a measure against vibration by enhancing the rigidity of the entire capacitor module. The related-art technology according to Japanese Patent Application Laid-open No. 2010-219259 is thus effective as a measure against a low frequency (lower than 2 kHz), for example, a primary mode.

However, the switching frequency of the power converter is typically 2 kHz or more. Further, the human audibility is most sensitive in a frequency band in the vicinity of 3 kHz. From the above, Japanese Patent Application Laid-open No. 2010-219259 has the problem of having a small effect on the measure against vibration (noise) at a high frequency.

Moreover, as a result of studies conducted, the applicants have found a mechanism in which, in the capacitor element formed by winding the metalized film in the flat shape, vibration from the flat wound surface is transmitted to a casing via a resin filler and a restraint point to vibrate the casing and generate noise. Therefore, in view of suppressing the noise, the positional relationship between the flat wound surface and a restraint unit, and a method for connection from the flat wound surface to the restraint unit are the problems.

SUMMARY OF THE INVENTION

The present invention has been made in order to solve the problems as described above in related-art power converters, and it is an object of the present invention to achieve small noise and small vibration, as well as a small size and a low cost in a power converter including a capacitor module.

According to one embodiment of the present invention, there is provided a power converter including: a power module including a switching element configured to perform power conversion; and a capacitor module including a smoothing capacitor configured to suppress variation of a power supply voltage supplied to the power module. In the power converter, the smoothing capacitor is formed of a plurality of capacitor elements each having a flat wound surface formed by winding a metalized film in a flat shape, and the capacitor module further includes: an exterior case configured to accommodate the plurality of capacitor elements inside of the exterior case; a resin filler with which a periphery of the plurality of capacitors is filled in the exterior case; and a restraint point between the capacitor module and the power converter. Further, in the power converter, the exterior case has arranged therein an inclusion serving as a beam in a direction orthogonal to a flat wound surface of at least one capacitor element of the plurality of capacitor elements, and the at least one capacitor element, and the restraint point is arranged substantially in front of the flat wound surface via the inclusion.

According to the power converter of the present invention, there is provided a structure for suppressing vibration of the flat wound surface by arranging the restraint point substantially in front of the flat wound surface of the capacitor element with the inclusion being placed between the restraint point and the flat wound surface. As a result, it is possible to achieve small noise and small vibration, as well as a small size and a low cost in the power converter including a capacitor module.

DESCRIPTION OF THE EMBODIMENTS

A capacitor module in embodiments of the present invention and a power converter using the same are described in detail with reference to FIG. 1 to FIG. 9.

First Embodiment

Figure 1:
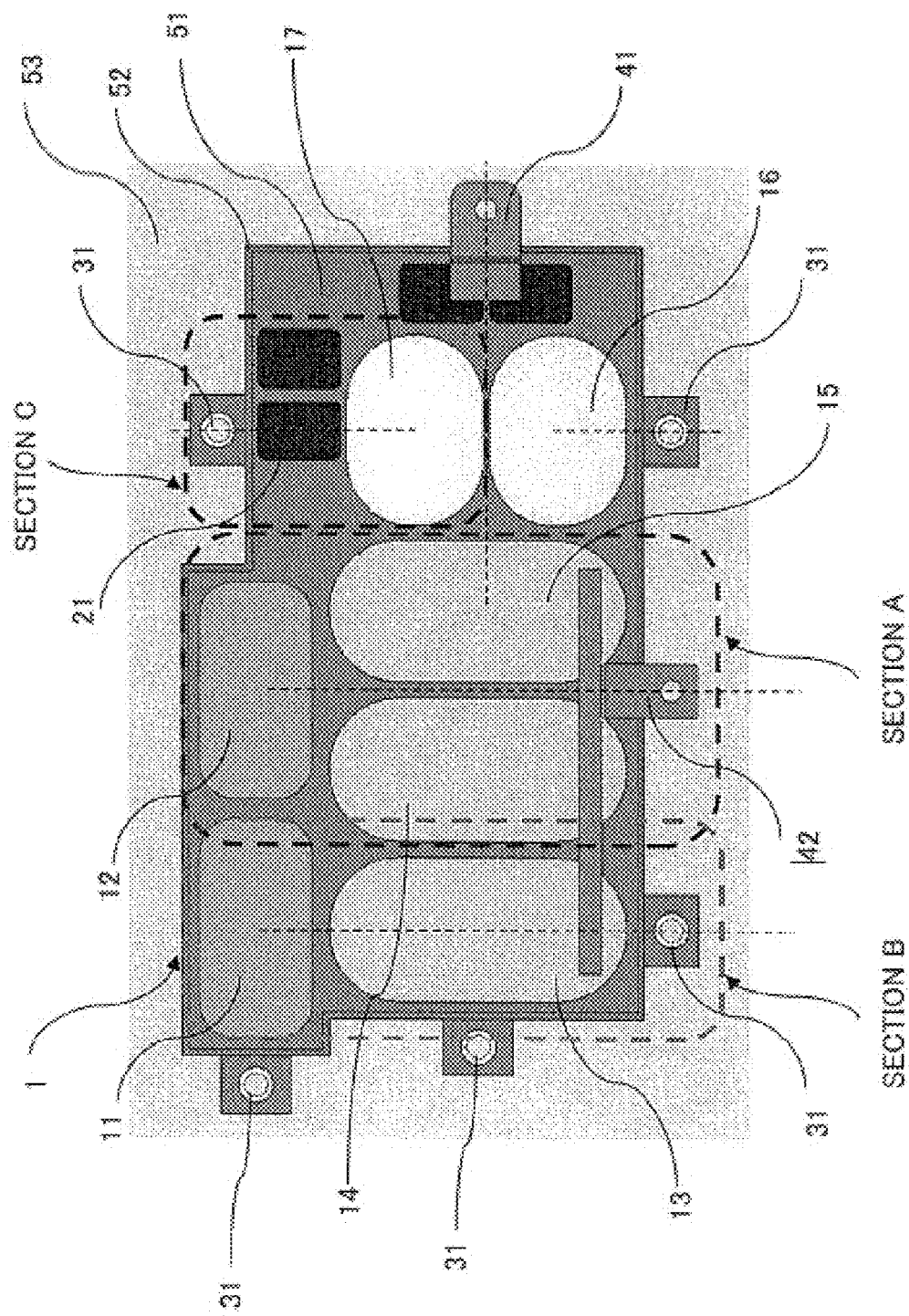
FIG. 1 is a plan view for illustrating a configuration example of a capacitor module in a first embodiment of the present invention.

FIG. 1 is a plan view for illustrating a configuration example of a capacitor module in a first embodiment of the present invention. A capacitor module 1 illustrated in FIG. 1 is configured by arranging, on the inside of an exterior case 52, capacitor elements 11 to 17, each of which is formed by winding a metalized film, and a resin filler 51, with which the periphery of the capacitor elements 11 to 17 is filled. The exterior case 52 is fixed to a casing 53. That is, the capacitor module 1 is restrained by the casing 53.

The capacitor elements 11 to 17 are each configured by winding a metalized film, which is formed by depositing a metal layer on the surface of a resin film (dielectric body), and then flattening the metalized film on two planes parallel to a winding axis direction by pressing. As illustrated in FIG. 1, the plurality of capacitor elements 11 to 17 each having such a configuration are arranged in the exterior case 52 with the winding axis direction facing an open surface of the case. In addition to the capacitor elements 11 to 17, Y capacitor elements 21 for removing noise are also mounted in the capacitor module 1 illustrated in FIG. 1.

The metalized film forming each of the capacitor elements 11 to 17 is formed by depositing a metal layer on the surface of the resin film as described above. Examples of the material of this resin film include polyethylene terephthalate (PET), polypropylene (PP), polyethylene naphthalate (PEN), polyphenylene sulfide (PPS), and polycarbonate (PC). Examples of the metal of the metal layer include aluminum, zinc, tin, copper, and an alloy thereof.

Further, metallikon metal is thermally sprayed onto both end surfaces in the winding axis direction of each of the capacitor elements 11 to 17. This metallikon metal forms electrodes of each of the capacitor elements 11 to 17.

Further, a pair of bus bars 42 to be connected to the electrodes of the plurality of capacitor elements 13 to 15 are arranged on the upper end surfaces and the lower end surfaces of the capacitor elements 13 to 15. The bus bars 42 are molded along with the capacitor elements 13 to 15 by use of the resin filler 51 inside the exterior case 52. Further, a bus bar 41 is molded along with the Y capacitor elements 21 by use of the resin filler 51 inside the exterior case 52.

The resin filler 51 is made of, for example, epoxy or urethane resin.

The exterior case 52 is made of a resin, for example, polyethylene terephthalate (PET), polypropylene (PP), polyphenylene sulfide (PPS), polycarbonate (PC), or polybutylene terephthalate (PBT), or a metal, for example, aluminum.

The casing 53 is made of a metal, for example, aluminum.

Figure 2:
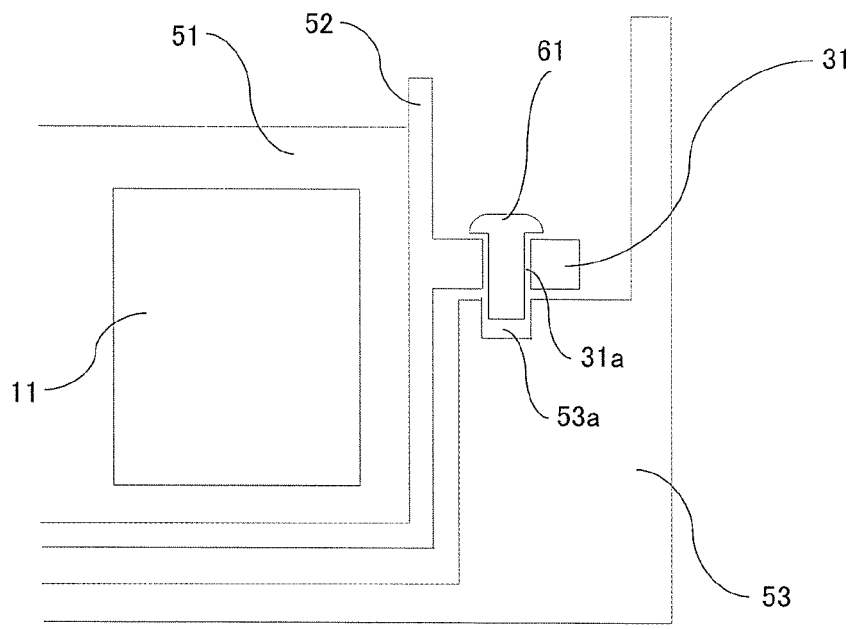
FIG. 2 is a sectional view for illustrating, as a first restraint structure, a structure for fixing an exterior case to a casing in the first embodiment of the present invention.

As illustrated in FIG. 1 above, a plurality of fixing legs 31 are used to fix the exterior case 52 to the casing 53. FIG. 2 is a sectional view for illustrating, as a first restraint structure, a structure for fixing the exterior case 52 to the casing 53 in the first embodiment of the present invention. As illustrated in FIG. 2, the fixing leg 31 is integrally molded with a body of the exterior case 52. Further, a bolt insertion hole 31a for insertion of a bolt 61 is vertically provided in the fixing leg 31.

Meanwhile, in the casing 53, a fixing receiver 53a is formed in a position corresponding to the bolt insertion hole 31a provided in the fixing leg 31 on the exterior case 52 side. A screw hole for screwing of the bolt 61 is vertically formed in the fixing receiver 53a.

Figure 3:
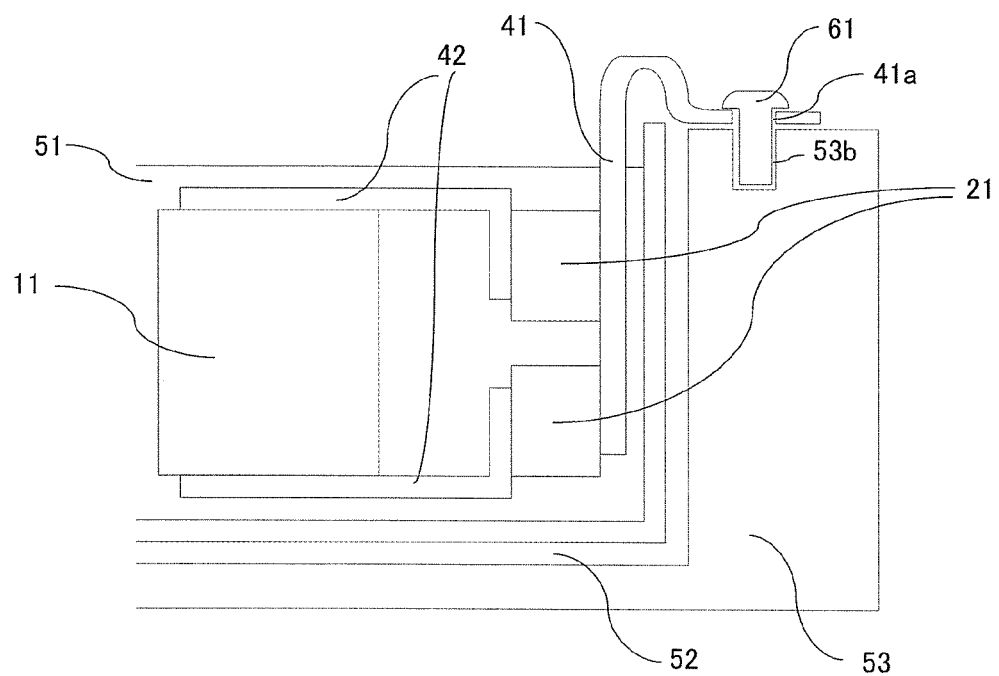
FIG. 3 is a sectional view for illustrating, as a second restraint structure, a structure for fixing a bus bar to the casing in the first embodiment of the present invention.

FIG. 3 is a sectional view for illustrating, as a second restraint structure, a structure for fixing the bus bar 41 to the casing 53 in the first embodiment of the present invention. Here, the bus bar 41 serves as a grounding bus bar, which connects between the capacitor module 1 and the casing 53. As illustrated in FIG. 3, a bolt insertion hole 41a for insertion of a bolt 61 is provided in the bus bar 41.

Meanwhile, in the casing 53, a fixing receiver 53b is formed in a position corresponding to the bolt insertion hole 41a provided in the bus bar 41. A screw hole for screwing of the bolt 61 is formed in the fixing receiver 53b, which has a similar structure to that of the fixing receiver 53a.

By using the first restraint structure illustrated in FIG. 2 and the second restraint structure illustrated in FIG. 3, the capacitor module 1 can be restrained in the casing 53. The capacitor module 1 illustrated in FIG. 1 above includes the fixing legs 31 at five positions. Further, such a capacitor module 1 is placed in the casing 53. Under this state, bolts 61 are inserted through the bolt insertion holes 31a of the fixing legs 31 and screwed into the screw holes of the fixing receivers 53a.

Further, the capacitor module 1 illustrated in FIG. 1 above includes the bus bar 41 at one position. Thus, under the state in which the capacitor module 1 is placed in the casing 53, the bolt 61 is inserted through the bolt insertion hole 41a of the bus bar 41 and screwed into the screw hole of the fixing receiver 53b. As a result, in the example of FIG. 1, the capacitor module 1 is screwed to the casing 53 by the first restraint structures provided at the five positions and the second restraint structure provided at the one position.

The capacitor module 1 is ultimately incorporated as a constituent of the power converter. It is thus possible to restrain the position of the capacitor module 1 by use of the bus bars 42, which connect between the capacitor module 1 and a power module forming a part of the power converter.

Figure 4:
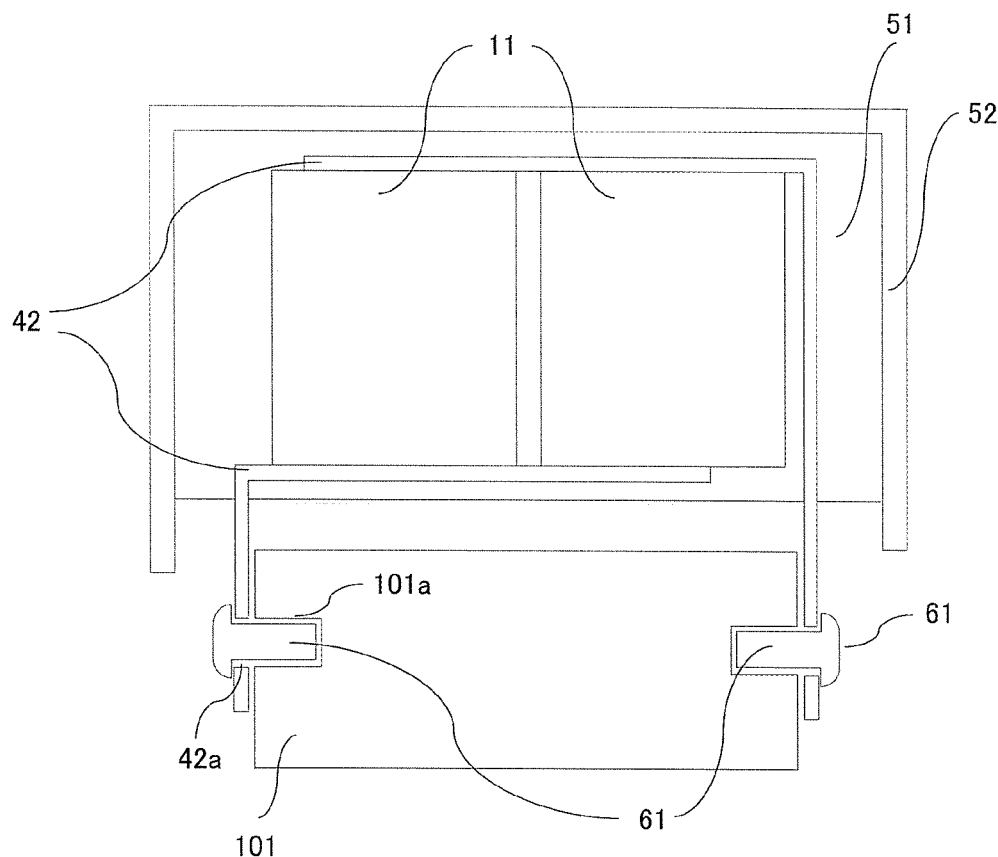
FIG. 4 is a sectional view for illustrating, as a third restraint structure, a structure for fixing the capacitor module to a power module by using bus bars in the first embodiment of the present invention.

FIG. 4 is a sectional view for illustrating, as a third restraint structure, a structure for fixing the capacitor module 1 to a power module 101 by use of the bus bars in the first embodiment of the present invention. One end of each of two bus bars 42 illustrated in FIG. 4 is connected to each of electrodes formed on both end surfaces in the winding axis direction of the capacitor element 11. Another end of each of two bus bars 42 is provided with a bolt insertion hole 42a for insertion of a bolt 61.

Meanwhile, in the power module 101, fixing receivers 101a are formed in positions corresponding to the bolt insertion holes 42a provided in the bus bars 42. A screw hole for screwing of the bolt 61 is formed in each of the fixing receivers 101a. Thus, in the example of FIG. 4, the capacitor module 1 is screwed to the power module 101 by the third restraint structures provided at two positions. As a result, the capacitor module 1 can be restrained by use of the third restraint structures to suppress vibration. A specific application example of this third restraint structure is described in a second embodiment of the present invention, which is described later.

Figure 5:
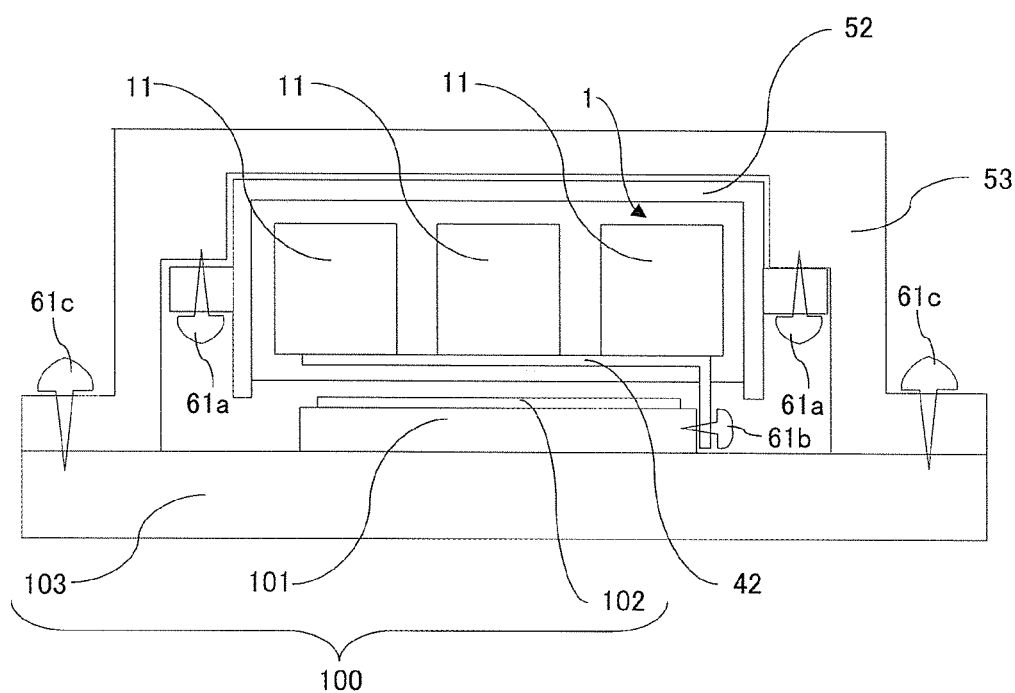
FIG. 5 is an explanatory view for illustrating an example in which the capacitor module in the first embodiment of the present invention is mounted in a power converter.

FIG. 5 is an explanatory view for illustrating an example in which the capacitor module 1 in the first embodiment of the present invention is mounted in the power converter. A power converter 100 illustrated in FIG. 5 includes the power module 101 forming a power conversion unit, a control circuit unit 102 configured to control the power module 101, the bus bar 42 into and from which power converted by the power module 101 is input and output, and a cooling member 103 configured to cool the power module 101.

Figure 6:
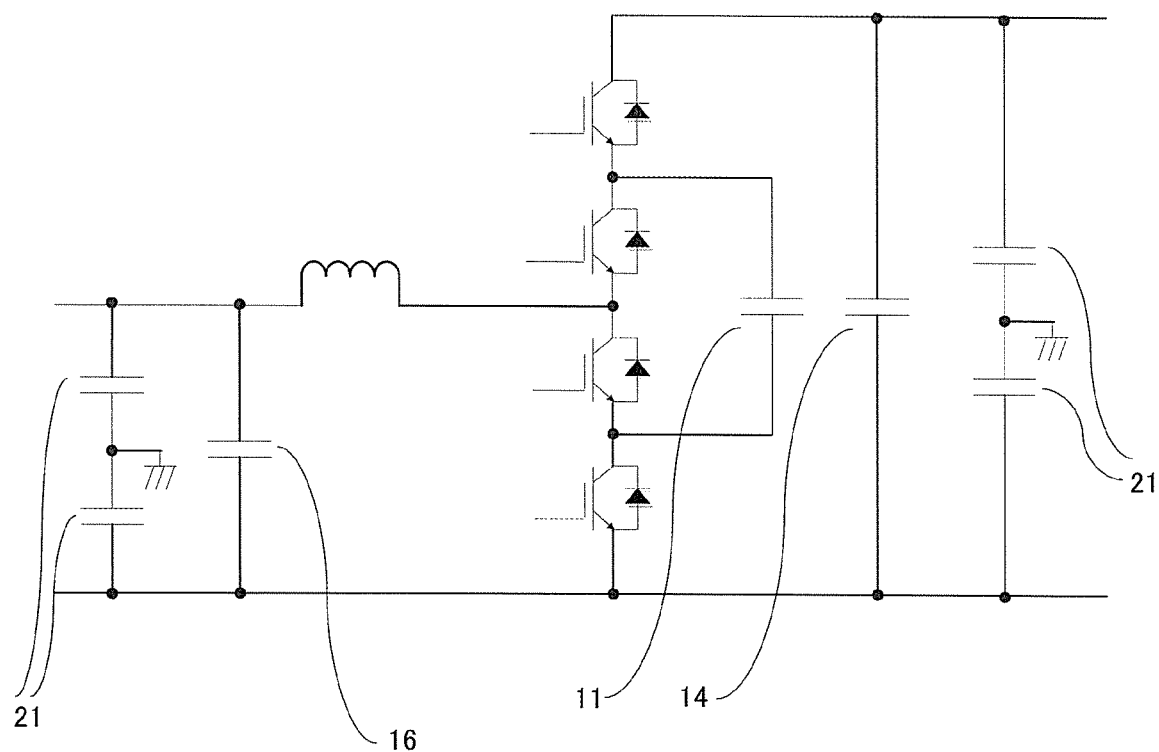
FIG. 6 is an example of a circuit diagram of the power converter according to the first embodiment of the present invention.

The capacitor module 1 is incorporated as a smoothing capacitor configured to smooth an intermittent current that is input into the bus bar 42 to a direct current. FIG. 6 is an example of a circuit diagram of the power converter according to the first embodiment of the present invention. The plurality of smoothing capacitor elements 11, 14, and 16 and the Y capacitor elements 21, which are illustrated in FIG. 6, are formed as the capacitor module 1 as illustrated in FIG. 1.

As illustrated in FIG. 5, the casing 53 for the capacitor module 1 also functions as a casing for the power converter 100.

In FIG. 5, by the first restraint structures or the second restraint structures, the capacitor module 1 is fastened to the casing 53 by use of bolts 61a. Further, by the third restraint structure, the capacitor module 1 is fastened to the power module 101 by use of a bolt 61b.

In FIG. 5, the casing 53 is fastened to the cooling member 103 being a part of the power converter 100 by use of bolts 61c. Therefore, by fixing the capacitor module 1 and the power converter 100 by use of the plurality of restraint structures as in FIG. 5, the vibration of the capacitor module 1 can be suppressed.

In the above description, the resin filler 51 is used as an inclusion serving as a beam in a direction orthogonal to the flat wound surface, and the fixing legs 31 or the bus bars 41 and 42 are used as the restraint points so that the vibration of the capacitor element is suppressed. In view of this, a specific configuration thereof is described based on a section A of FIG. 1.

In the section A of FIG. 1, the resin filler 51 is arranged as the inclusion serving as the beam in the direction orthogonal to the flat wound surface of the capacitor element 12. That is, the section A corresponds to the example in which the bus bars 42 are arranged as the restraint points with respect to the flat wound surface in addition to the use of the resin filler 51, which is the inclusion serving as the beam.

In such a manner, in the section A, the restraint points that are formed by the bus bars 42 are arranged substantially in front of the flat wound surface via the resin filler 51 being the inclusion against the vibration of the flat wound surface in the capacitor element 12 formed by winding the metalized film in the flat shape. As a result, the vibration of the capacitor element 12 can be suppressed, and thus a power converter with small noise, small vibration, and a small size can be achieved.

In the present invention, the inclusion serving as the beam as described above is not limited to the resin filler 51. Therefore, inclusions other than the resin filler 51 are described with reference to FIG. 1 above.

In a section B of FIG. 1, the capacitor element 13 is arranged as the inclusion serving as the beam in the direction orthogonal to the flat wound surface of the capacitor element 11. Here, the flat wound surface of the capacitor element 11 and the flat wound surface of the capacitor element 13 being the inclusion have the positional relationship of being orthogonal to each other. That is, the section B corresponds to the example in which the fixing leg 31 is arranged as the restraint point with respect to the flat wound surface via the capacitor element 13, which is the inclusion serving as the beam.

As thus described, also in the section B, similarly to the section A, the restraint point that is formed by the fixing leg 31 is arranged in addition to the provision of the orthogonally arranged capacitor element 13 as the inclusion substantially in front of the flat wound surface in the capacitor element 11 formed by winding the metalized film in the flat shape against the vibration of the flat wound surface. As a result, the vibration of the capacitor element 11 can be suppressed, and thus a power converter with small noise, small vibration, and a small size can be achieved.

Further, in a section C of FIG. 1, the Y capacitor element 21, which is mounted for removing noise, is arranged as the inclusion serving as the beam in the direction orthogonal to the flat wound surface of the capacitor element 17. That is, the section C corresponds to the example in which the fixing leg 31 is arranged as the restraint point with respect to the flat wound surface via the Y capacitor element 21, which is the inclusion serving as the beam.

As thus described, also in the section C, similarly to the section B, the restraint point that is formed by the fixing leg 31 is arranged in addition to the provision of the orthogonally arranged capacitor element 21 as the inclusion substantially in front of the flat wound surface in the capacitor element 17 formed by winding the metalized film in the flat shape against the vibration of the flat wound surface. As a result, the vibration of the capacitor element 17 can be suppressed, and thus a power converter with small noise, small vibration, and a small size can be achieved.

As described above, according to the first embodiment, there is provided the structure in which the restraint point is provided in addition to arranging the inclusion so as to be orthogonal to the flat wound surface in the capacitor element formed by winding the metalized film in the flat shape against the vibration of the flat wound surface. As a result, particularly the vibration of the capacitor element in the direction of the flat wound surface can be suppressed.

That is, the inclusion illustrated in the first embodiment is any one of a part of the resin filler, the capacitor element, and the Y capacitor element, and hence there is no need for arranging another special new member as the inclusion. Therefore, there is no problem of an increase in number of components, and no increase in process number, cost, or size is caused.

In other words, in the capacitor module in the first embodiment, the inclusion is configured by making appropriate layout design such that a gap is provided between the capacitor elements to be filled with resin, or that the capacitor element is arranged so as to be orthogonal to the flat wound surface. Further, the capacitor module has a structure in which the capacitor module and the casing are fastened via the inclusion, using the fixing legs or the bus bars as the restraint points.

As a result, it is possible to suppress the vibration of the capacitor module without increasing the number of components. Hence it is possible to achieve small noise and small vibration, as well as a small size and a low cost as to the power converter including the capacitor module.

Second Embodiment

In the second embodiment, a specific description is given of an application example in which the power converter according to the above-mentioned first embodiment is mounted in a vehicle.

Figure 7:
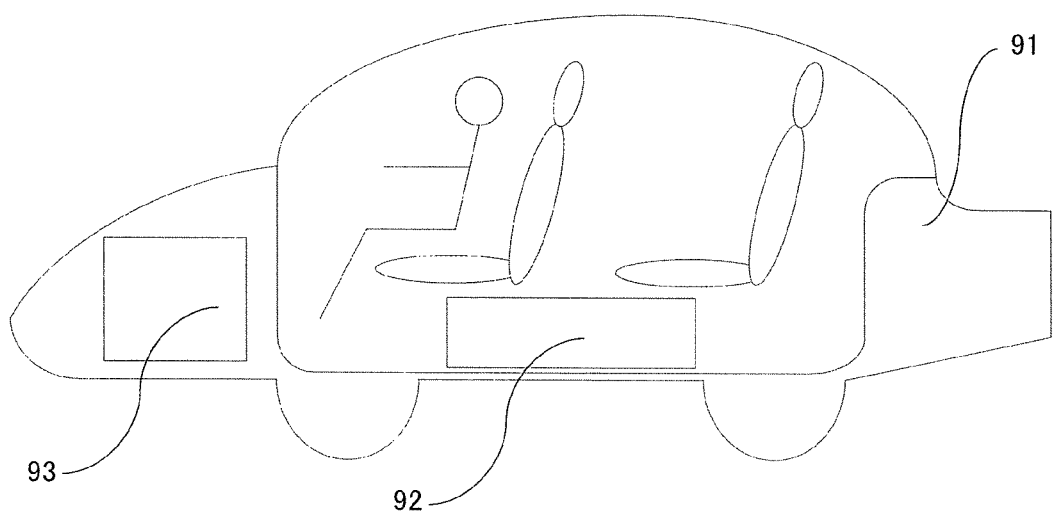
FIG. 7 is an explanatory view for illustrating a specific example in which a capacitor module in a second embodiment of the present invention is mounted in a vehicle.

FIG. 7 is an explanatory view for illustrating a specific example in which a capacitor module in the second embodiment of the present invention is mounted in a vehicle. A vehicle 91 illustrated in FIG. 7 includes a storage box 92 of a high voltage device, for example, a battery, and a driving device 93 having a motor built therein. In the example of FIG. 7, the storage box 92 is mounted in the central lower part of the vehicle 91. In the example of FIG. 7, the driving device 93 is mounted in the front part of the vehicle 91.

Figure 8:
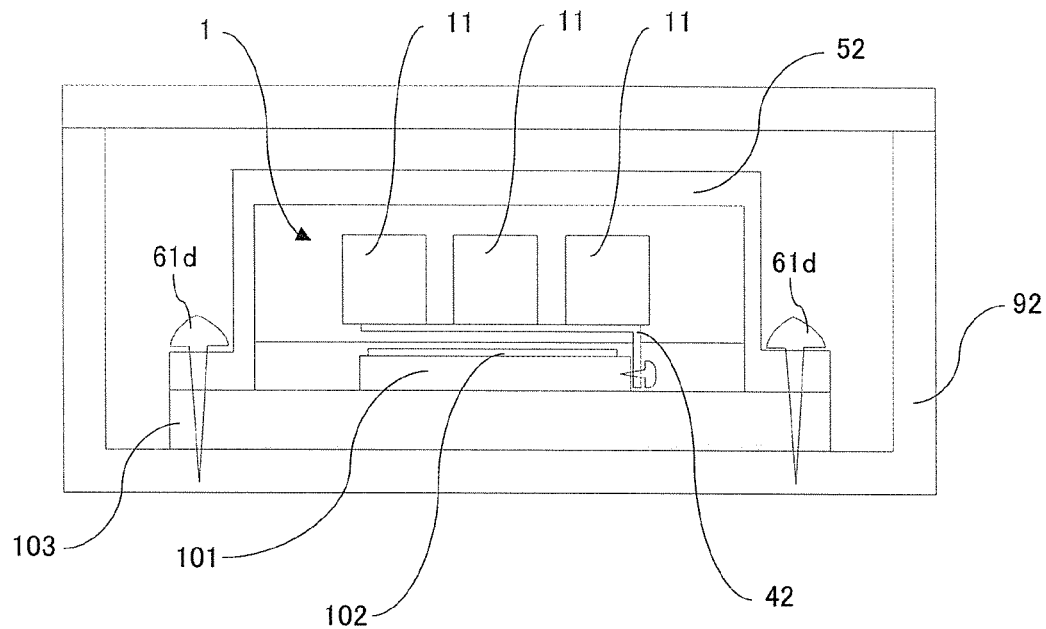
FIG. 8 is an explanatory view for illustrating a specific example in which the capacitor module in the second embodiment of the present invention is mounted in a storage box in the vehicle.

FIG. 8 is an explanatory view for illustrating a specific example in which the capacitor module in the second embodiment of the present invention is mounted in the storage box 92 in the vehicle 91. In FIG. 8, the exterior case 52 of the capacitor module 1 is fastened to the storage box 92 via the cooling member 103 by use of bolts 61d.

In order to reduce the mounting space or to reduce cost by reducing the number of components, for example, as illustrated in FIG. 8, the power converter 100 may be installed in the storage box 92 of the high voltage device, for example, the battery. In that case, there is a problem in that vibration transmitted from the exterior case 52 is transmitted to the storage box 92 in the vehicle 91 and the storage box 92 becomes a source of noise. Further, the power converter 100 has a problem in that noise (vibration) is transmitted to a vehicle occupant, depending on the place at which the power converter 100 is arranged in the vehicle 91.

In order to deal with such problems, the power converter 100 described in the first embodiment is used to enable reduction in noise and vibration in the power converter 100 including the capacitor module 1. As a result, it is possible to reduce noise and vibration also in the vehicle itself in which the power converter 100 is mounted.

Figure 9:
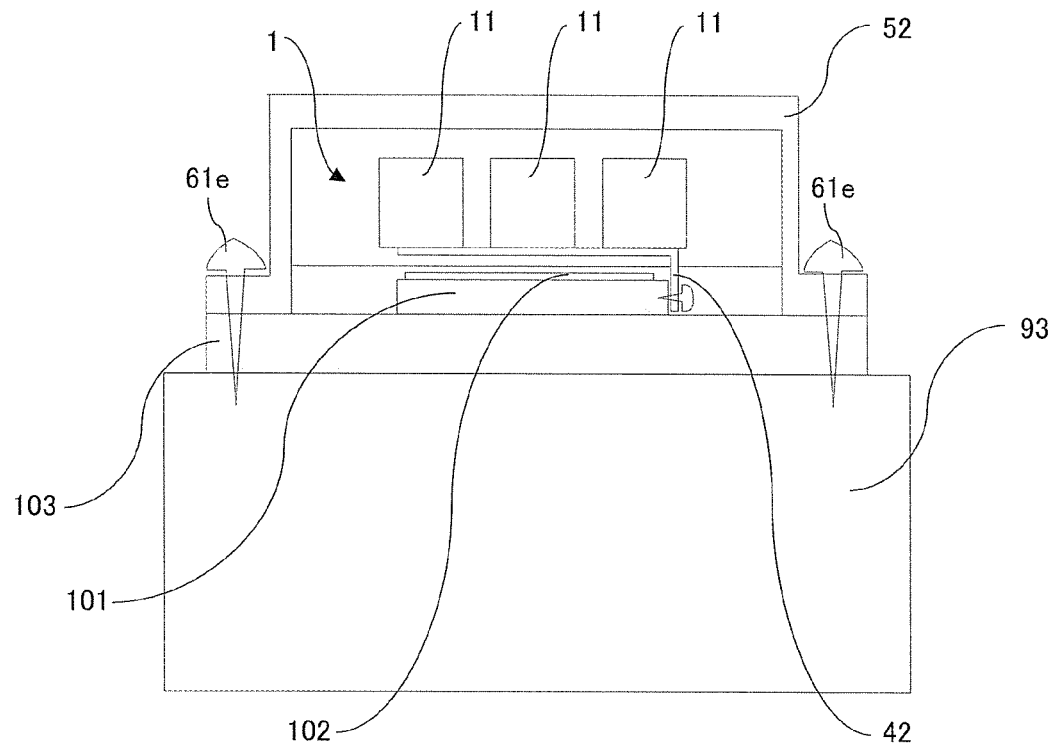
FIG. 9 is an explanatory view for illustrating a specific example in which the capacitor module in the second embodiment of the present invention is mounted on a driving device in the vehicle.

FIG. 9 is an explanatory view for illustrating a specific example in which the capacitor module in the second embodiment of the present invention is mounted on the driving device 93 in the vehicle 91. In FIG. 9, the exterior case 52 of the capacitor module 1 is fastened to the driving device 93 via the cooling member 103 by use of bolts 61e.

In order to reduce the mounting space or to reduce cost by reducing the number of components, for example, as illustrated in FIG. 9, the power converter 100 may be installed onto the driving device 93 having a motor mounted therein. In that case, there is a problem in that the vibration transmitted from the exterior case 52 is transmitted to the driving device 93 in the vehicle 91 and the driving device 93 becomes a source of noise. Further, the power converter 100 has a problem in that noise (vibration) is transmitted to a vehicle occupant, depending on the place at which the power converter 100 is arranged in the vehicle 91.

In order to deal with such problems, the power converter 100 described in the first embodiment is used to enable reduction in noise and vibration in the power converter 100 including the capacitor module 1. As a result, it is possible to reduce noise and vibration also in the vehicle itself in which the power converter 100 is mounted.

What is claimed is:

1. A power converter, comprising:
a power module including a switching element configured to perform power conversion; and
a capacitor module including a smoothing capacitor configured to suppress variation of a power supply voltage supplied to the power module,
wherein the smoothing capacitor is formed of a plurality of capacitor elements each having a flat wound surface formed by winding a metalized film in a flat shape,
wherein the capacitor module further includes:
an exterior case configured to accommodate the plurality of capacitor elements inside of the exterior case;
a resin filler with which a periphery of the plurality of capacitors is filled in the exterior case;
a restraint point between the capacitor module and the power converter; and
a beam element extending from at least one capacitor element from among the plurality of capacitor elements to the restraint point in a direction orthogonal to the flat wound surface of the at least one capacitor element, the beam element being defined by edges of first and second adjacent capacitor elements that are positioned between the at least one capacitor element and the restraint point,
wherein the restraint point is arranged substantially in front of the flat wound surface on an opposite end of the beam element from the flat wound surface.

2. The power converter according to claim 1, wherein the plurality of capacitor elements are arranged such that a winding axis direction faces an open surface of the exterior case.

3. The power converter according to claim 1, wherein the beam element includes a portion of the resin filler with which the periphery of the at least one capacitor element is filled.

4. The power converter according to claim 1, wherein the restraint point includes a restraint point that is formed by a fixing leg provided in the exterior case so as to fix the exterior case to a casing of the power converter.

5. A power converter according to claim 1,
wherein the restraint point includes a restraint point that is formed by a first bus bar connected to the at least one capacitor element, and
wherein the first bus bar is a bus bar connecting between the capacitor module and the power module.

6. The power converter according to claim 1, wherein the power converter includes a casing, which is a cooling member configured to cool the power module.

7. A power converter, comprising:
a power module including a switching element configured to perform power conversion; and
a capacitor module including a smoothing capacitor configured to suppress variation of a power supply voltage supplied to the power module, wherein the smoothing capacitor is formed of a plurality of capacitor elements each having a flat wound surface formed by winding a metalized film in a flat shape, wherein the capacitor module further includes:
- an exterior case configured to accommodate the plurality of capacitor elements inside of the exterior case;
- a resin filler with which a periphery of the plurality of capacitors is filled in the exterior case;
- a restraint point between the capacitor module and the power converter; and
- a beam element extending from at least one capacitor element from among the plurality of capacitor elements to the restraint point in a direction orthogonal to the flat wound surface of at least one capacitor element, wherein the restraint point is arranged substantially in front of the flat wound surface on an opposite end of the beam element from the flat wound surface, wherein the beam element includes a capacitor element adjacent to the at least one capacitor element from among the plurality of capacitor elements, and wherein the adjacent capacitor is arranged between the at least one capacitor element and the restraint point such that the flat wound surface of the adjacent capacitor is orthogonal to the flat wound surface of the at least one capacitor element.

8. A power converter, comprising:

a power module including a switching element configured to perform power conversion; and a capacitor module including a smoothing capacitor configured to suppress variation of a power supply voltage supplied to the power module, wherein the smoothing capacitor is formed of a plurality of capacitor elements each having a flat wound surface formed by winding a metalized film in a flat shape, wherein the capacitor module further includes:
- an exterior case configured to accommodate the plurality of capacitor elements inside of the exterior case;
- a resin filler with which a periphery of the plurality of capacitors is filled in the exterior case;
- a restraint point between the capacitor module and the power converter; and
- a beam element extending from at least one capacitor element from among the plurality of capacitor elements to the restraint point in a direction orthogonal to the flat wound surface of at least one capacitor element, wherein the restraint point is arranged substantially in front of the flat wound surface on an opposite end of the beam element from the flat wound surface, wherein the capacitor module further includes a Y capacitor element configured to remove noise of power that is input into and output from the power module, the Y capacitor element being located adjacent to the at least one capacitor element, wherein the beam element includes the Y capacitor element, and wherein the adjacent Y capacitor element is arranged between the at least one capacitor element and the restraint point so as to be orthogonal to the flat wound surface of the at least one capacitor element.

9. A power converter according to claim 8, wherein the restraint point includes a restraint point that is formed by a second bus bar connected to the Y capacitor element, and wherein the second bus bar is a grounding bus bar connecting between the capacitor module and the exterior case.

* * * * *